(12) United States Patent
Egan et al.

(10) Patent No.: US 10,185,333 B2
(45) Date of Patent: Jan. 22, 2019

(54) METHOD AND SYSTEM FOR SELECTING A DEVICE FROM A GRAPHICAL INTERFACE

(71) Applicant: S.A. Armstrong Limited, Scarborough (CA)

(72) Inventors: Anthony Egan, Scarborough (CA); Steve Mohan Gulati, Scarborough (CA); Mahatelge Brian Mark Peiris, Scarborough (CA)

(73) Assignee: S.A. Armstrong Limited, Scarborough, Ontario (CA)

( * ) Notice: Subject to any disclaimer, the term of this patent is extended or adjusted under 35 U.S.C. 154(b) by 823 days.

(21) Appl. No.: 14/374,860

(22) PCT Filed: Nov. 1, 2012

(86) PCT No.: PCT/CA2012/050777
§ 371 (c)(1),
(2) Date: Jul. 25, 2014

(87) PCT Pub. No.: WO2013/110166
PCT Pub. Date: Aug. 1, 2013

(65) Prior Publication Data
US 2015/0007083 A1    Jan. 1, 2015

Related U.S. Application Data

(60) Provisional application No. 61/591,234, filed on Jan. 26, 2012.

(51) Int. Cl.
*G05D 13/62* (2006.01)
*G06Q 10/06* (2012.01)
(Continued)

(52) U.S. Cl.
CPC .............. *G05D 13/62* (2013.01); *F24F 11/83* (2018.01); *G05B 15/02* (2013.01); *G06F 3/0482* (2013.01);
(Continued)

(58) Field of Classification Search
None
See application file for complete search history.

(56) References Cited

U.S. PATENT DOCUMENTS 4,463,574 A * 8/1984 Spethmann .......... F24F 11/0009
236/1 EA
5,292,855 A    3/1994 Krutak et al.
(Continued)

FOREIGN PATENT DOCUMENTS

CA    2231321 C    6/2000
CA    2703686 A1    5/2009
(Continued)

OTHER PUBLICATIONS

"ECO:nomics—A Lower Carbon Footprint at No Extra Cost", S.A. Armstrong, Feb. 24, 2009.
(Continued)

*Primary Examiner* — Christopher J Fibbi
(74) *Attorney, Agent, or Firm* — Bret E. Field; Bozicevic, Field & Francis LLP

(57) ABSTRACT

A method, computer system, and computer readable medium for facilitating selection from a plurality of devices, each device defined by a selection range dependent on at least a first parameter and a second parameter, the first parameter and the second parameter being correlated. The method includes: displaying on a graphical interface screen a graph of the first parameter versus the second parameter, the graph having displayed thereon a plurality of regions representing the selection ranges, receiving selection of at least a point of
(Continued)

the graph from an indicator overlaid onto the graph and which is moveable on the graphical interface screen based on control from an input device, and in response to the selection, displaying on the graph only the regions which are relevant to the selected point.

12 Claims, 12 Drawing Sheets

(51) Int. Cl.
  *G06Q 10/00*  (2012.01)
  *G05B 15/02*  (2006.01)
  *G06F 3/0482*  (2013.01)
  *G06F 3/0484*  (2013.01)
  *G06T 11/20*  (2006.01)
  *F24F 11/83*  (2018.01)
  *G06F 17/50*  (2006.01)
  *F24F 11/46*  (2018.01)

(52) U.S. Cl.
  CPC ..... *G06F 3/04842* (2013.01); *G06Q 10/0639* (2013.01); *G06Q 10/06312* (2013.01); *G06Q 10/20* (2013.01); *G06T 11/206* (2013.01); *F24F 11/46* (2018.01); *F25B 2600/13* (2013.01); *G06F 17/5086* (2013.01)

(56) References Cited

U.S. PATENT DOCUMENTS

| | | | |
|---|---|---|---|
| 5,303,561 A | 4/1994 | Bahel et al. | |
| 6,166,499 A | 12/2000 | Kanamori et al. | |
| 6,178,393 B1 | 1/2001 | Irvin | |
| 6,271,927 B1 | 8/2001 | Kohtani et al. | |
| 6,446,014 B1 | 9/2002 | Ocondi | |
| 6,670,972 B2 * | 12/2003 | Grieve | G06F 3/04847 711/170 |
| 6,918,307 B2 * | 7/2005 | Ohlsson | F04D 15/0088 415/17 |
| 7,036,559 B2 * | 5/2006 | Stanimirovic | F24F 11/0086 165/11.1 |
| 7,050,873 B1 * | 5/2006 | Discenzo | G05B 13/024 700/28 |
| 7,341,201 B2 † | 3/2008 | Stanimirovic | |
| 8,235,776 B2 † | 8/2012 | Stanimirovic | |
| 8,653,968 B2 | 2/2014 | Brown et al. | |
| 8,712,741 B2 * | 4/2014 | Perry | G06F 17/50 703/19 |
| 2003/0221172 A1 | 11/2003 | Brathwaite et al. | |
| 2007/0135972 A1 | 6/2007 | Jacobson | |
| 2008/0007555 A1 * | 1/2008 | Vrba | G06T 11/20 345/440 |
| 2008/0209903 A1 | 9/2008 | Itoga et al. | |
| 2009/0204245 A1 | 8/2009 | Sustaeta et al. | |
| 2009/0249237 A1 * | 10/2009 | Jundt | G05B 19/0426 715/769 |
| 2009/0254452 A1 | 10/2009 | Vailaya et al. | |
| 2011/0060470 A1 | 3/2011 | Campbell et al. | |
| 2011/0066298 A1 | 3/2011 | Francino et al. | |
| 2011/0080264 A1 | 4/2011 | Clare et al. | |
| 2011/0098901 A1 | 4/2011 | Shiomi et al. | |
| 2011/0145156 A1 | 6/2011 | Feng et al. | |
| 2012/0239169 A1 | 9/2012 | Smith et al. | |
| 2013/0030555 A1 * | 1/2013 | Starr | G05B 23/0216 700/83 |
| 2013/0060720 A1 | 3/2013 | Burke | |
| 2013/0103352 A1 | 4/2013 | ter Horst et al. | |
| 2013/0158952 A1 | 6/2013 | Liebel et al. | |

FOREIGN PATENT DOCUMENTS

| | | |
|---|---|---|
| JP | 60180490 A | 9/1985 |
| WO | WO2010037145 A2 | 4/2010 |
| WO | 2013110164 A1 | 8/2013 |
| WO | 2013110165 A1 | 8/2013 |

OTHER PUBLICATIONS

"IVS & IVS Sensorless Series—Intelligent Variable Speed Pumps", S.A. Armstrong, Aug. 23, 2011.

* cited by examiner
† cited by third party

Recommendation Priority Config

Description of recommendation priorities

☐ Variable Speed Settings

| Item | Sort Priority 1122 | %Weight 1126 |
|---|---|---|
| 1104 → 1. Best Value | 1 | 27.8% |
| 1106 → 2. Best Speed | 2 | 19.8% |
| 1108 → 3. Lowest Price | 4 | 10.3% |
| 1110 → 4. Highest Efficiency | 3 | 15.9% |
| 1112 → 5. Closest to target growth capacity | 5 | 4.0% |
| 1114 → 6. Closest to BEP flow (on Avg. Load flow) | 3 | 15.9% |
| 1116 → 7. Highest Avg. Load Eff. | 6 | 1.6% |
| 1118 → 8. Lowest Delta Load Eff. (Standard Deviation 1) | 6 | 1.6% |
| 1120 → 9. Lowest Operating Cost | 6 | 1.6% |
| 1102 → 10. Highest Cost Savings Index | 6 | 1.6% |

1128 → Total Weight: 126    100.0%

Priority Weights

| Priority | Weight |
|---|---|
| 1 | 35 |
| 2 | 25 |
| 3 | 20 |
| 4 | 13 |
| 5 | 5 |
| 6 | 2 |

← 1124

[OK] [Cancel]

FIGURE 11

METHOD AND SYSTEM FOR SELECTING A DEVICE FROM A GRAPHICAL INTERFACE

CROSS-REFERENCE

This application claims the benefit of priority to U.S. Patent Application No. 61/591,234, filed Jan. 26, 2012, the contents of which are herein incorporated by reference.

TECHNICAL FIELD

Some example embodiments relate to the field of circulating devices such as pumps, boosters and fans, and related systems.

BACKGROUND

In some conventional systems, manufacturer specifications for equipment are published with maximum load ratings. As an example, for fixed speed HVAC (heating, ventilation, and air conditioning) pump systems, performance criteria may be based on a narrow band of conditions, optimizing for occupant use during maximum load, which often meant sacrificing operating efficiency during part-load conditions.

Prior to variable speed drives, some conventional industry practices meant designing heating, cooling and plumbing system performance around a single point that represented the most extreme conditions or loads that a building might experience during its operating lifecycle.

A difficulty with some existing systems is that, at part-load, the pumping system may be susceptible to instability, poor occupant comfort and energy and economic wastage.

The traditional selection of a pump or pumps may result in wastage of resources and inefficient operation. Load limits for a building may vary so that the variable speed equipment, (e.g. pump, boiler plant, booster or other) may not be required to operate at full capacity to service the system requirements. Further, improper equipment selection may require a repair or total replacement of the equipment to a more suitable size of equipment (e.g. pump, boiler plant, booster, or other).

Additional difficulties with existing systems may be appreciated in view of the detailed description below.

SUMMARY

In accordance with an example embodiment, there is provided a method for facilitating selection from a plurality of devices, each device defined by a selection range dependent on at least a first parameter and a second parameter, the first parameter and the second parameter being correlated. The method includes: displaying on a graphical interface screen a graph of the first parameter versus the second parameter, the graph having displayed thereon a plurality of regions representing the selection ranges, receiving selection of at least a point of the graph from an indicator overlaid onto the graph and which is moveable on the graphical interface screen based on control from an input device, and in response to the selection, displaying on the graph only the regions which are relevant to the selected point.

In accordance with another example embodiment, there is provided a computer system, including: a controller and memory for storing information of a plurality of devices and of a selection range for each device dependent on at least a first parameter and a second parameter, the first parameter and the second parameter being correlated. The controller is configured to: generate for display on a graphical interface screen a graph of the first parameter versus the second parameter, the graph having displayed thereon a plurality of regions representing the selection ranges, receive selection of at least a point of the graph from an indicator overlaid onto the graph and which is movable on the graphical interface screen based on control from an input device, and in response to said selection, generate for display on the graph only the regions which are relevant to the selected point.

In accordance with yet another example embodiment, there is provided a non-transitory computer readable medium having instructions stored thereon executable by a processor for facilitating selection from a plurality of devices, each device defined by a selection range dependent on at least a first parameter and a second parameter, the first parameter and the second parameter being correlated, the instructions including: instructions for generating for display on a graphical interface screen a graph of the first parameter versus the second parameter, the graph having displayed thereon a plurality of regions representing the selection ranges; instructions for receiving selection of at least a point of the graph from an indicator overlaid onto the graph and which is moveable on the graphical interface screen based on control from an input device; and instructions for, in response to said selection, generating for display on the graph only the regions which are relevant to the selected point.

BRIEF DESCRIPTION OF THE DRAWINGS

Embodiments will now be described, by way of example only, with reference to the attached Figures, wherein:

FIG. 11 shows an example graphical user interface (GUI) for configuring a priority order for devices.

Like reference numerals may be used throughout the Figures to denote similar elements and features.

DETAILED DESCRIPTION OF EXAMPLE EMBODIMENTS

Figure 1:
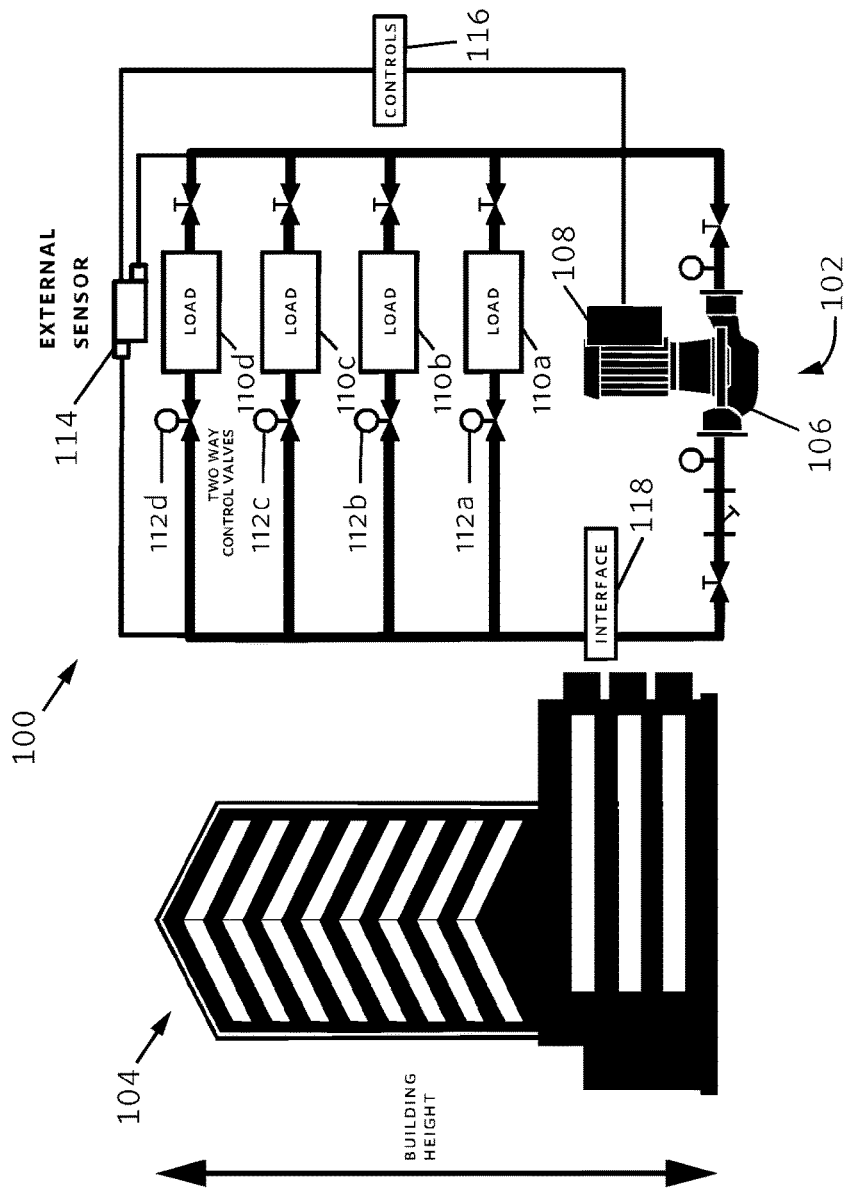
FIG. 1 illustrates an example block diagram of a circulating system having an intelligent variable speed pump, to which example embodiments may be applied.

Example embodiments generally relate to circulating devices such as pumps, boosters and fans, and related systems.

In accordance with an example embodiment, there is provided a method for facilitating selection from a plurality of devices, each device defined by a selection range dependent on at least a first parameter and a second parameter, the first parameter and the second parameter being correlated. The method includes: displaying on a graphical interface screen a graph of the first parameter versus the second parameter, the graph having displayed thereon a plurality of regions representing the selection ranges, receiving selection of at least a point of the graph from an indicator overlaid onto the graph and which is moveable on the graphical interface screen based on control from an input device, and in response to the selection, displaying on the graph only the regions which are relevant to the selected point.

In accordance with another example embodiment, there is provided a computer system, including: a controller and memory for storing information of a plurality of devices and of a selection range for each device dependent on at least a first parameter and a second parameter, the first parameter and the second parameter being correlated. The controller is configured to: generate for display on a graphical interface screen a graph of the first parameter versus the second parameter, the graph having displayed thereon a plurality of regions representing the selection ranges, receive selection of at least a point of the graph from an indicator overlaid onto the graph and which is movable on the graphical interface screen based on control from an input device, and in response to said selection, generate for display on the graph only the regions which are relevant to the selected point.

In accordance with yet another example embodiment, there is provided a non-transitory computer readable medium having instructions stored thereon executable by a processor for facilitating selection from a plurality of devices, each device defined by a selection range dependent on at least a first parameter and a second parameter, the first parameter and the second parameter being correlated, the instructions including: instructions for generating for display on a graphical interface screen a graph of the first parameter versus the second parameter, the graph having displayed thereon a plurality of regions representing the selection ranges; instructions for receiving selection of at least a point of the graph from an indicator overlaid onto the graph and which is moveable on the graphical interface screen based on control from an input device; and instructions for, in response to said selection, generating for display on the graph only the regions which are relevant to the selected point.

In accordance with an example embodiment, there is provided a method to define a selection range of an intelligent variable speed device or system, with an envelope border line, for a variety of design day conditions, that is defined to comply with industry standards and codes for part load performance (such as ASHRAE 90.1 standard for energy savings of 70% at 50% design day flow, 20:1 turn down capacity for a chiller plant).

Reference is first made to FIG. 1 which shows in block diagram form a circulating system 100 having an intelligent variable speed circulating device such as a control pump 102, to which example embodiments may be applied. The circulating system 100 may relate to a building 104 (as shown), a campus (multiple buildings), or other suitable infrastructure. The control pump 102 may include one or more pump devices 106 (one shown) and a control device 108 for controlling operation of the pump device 106. The particular circulating medium may vary depending on the particular application, and may for example include glycol, water, air, and the like.

As illustrated in FIG. 1, the circulating system 100 may include one or more loads 110a, 110b, 110c, 110d, wherein each load may be a varying usage requirement based on HVAC, plumbing, etc. Each 2-way valve 112a, 112b, 112c, 112d may be used to manage the flow rate to each respective load 110a, 110b, 110c, 110d. As the differential pressure across the load decreases, the control device 108 responds to this change by increasing the pump speed of the pump device 106 to maintain a pressure setpoint. If the differential pressure across the load increases, the control device 108 responds to this change by decreasing the pump speed of the pump device 106 to maintain the pressure setpoint. In some example embodiments, the control valves 112a, 112b, 112c, 112d can include faucets or taps for controlling flow to plumbing systems.

The control device 108 may include an internal sensor, sometimes referred to as a "sensorless" pump because an external sensor is not required. The internal sensor may detect, for example, the power and speed of the pump device 106. The pump speed of the pump device 106 may be varied to maintain the pressure setpoint in dependence of the internal sensor. A program map may be used by the control device 108 to map a detected power and speed to a resultant head and flow.

Referring still to FIG. 1, an external sensor 114 and associated controls 116 may be used to measure the differential pressure across the loads 110a, 110b, 110c, 110d, wherein the controls 116 receive and communicate this information to the control pump 102. The pump speed of the pump device 106 may be varied to maintain the pressure setpoint in dependence of the received signal or instruction from the controls 116. Some examples may also be applied to these types of systems having an external sensor 114.

In some examples, the circulating system 100 may be a chilled circulating system ("chiller plant"). The chiller plant may include an interface 118 in thermal communication with a secondary circulating system for the building 104. The control valves 112a, 112b, 112c, 112d manage the flow rate to the cooling coils (e.g., load 110a, 110b, 110c, 110d). Each 2-way valve 112a, 112b, 112c, 112d may be used to manage the flow rate to each respective load 110a, 110b, 110c, 110d. As a valve 112a, 112b, 112c, 112d opens, the differential pressure across the valve decreases. The control device 108 responds to this change by increasing the pump speed of the pump device 106 to maintain the pressure setpoint. If a control valve 112a, 112b, 112c, 112d closes, the differential pressure across the valve increases, and the control device 108 responds to this change by decreasing the pump speed of the pump device 106 to maintain the pressure setpoint.

In some other examples, the circulating system 100 may be a heating circulating system ("heating plant"). The heater plant may include an interface 118 in thermal communication with a secondary circulating system for the building 104. In such examples, the control valves 112a, 112b, 112c, 112d manage the flow rate to heating elements (e.g., load 110a, 110b, 110c, 110d).

Referring still to FIG. 1, it would be appreciated that the pump device 106 may take on various forms of pumps which have variable speed control. In some example embodiments, the pump device 106 includes at least a sealed casing which houses the pump device 106, which at least defines an input element for receiving a circulating medium and an output element for outputting the circulating medium. The pump device 106 includes a variable motor which can be variably controlled from the control device 108 to rotate at variable speeds. The pump device 106 includes an impeller which is operably coupled to the motor and spins based on the speed of the motor, to circulate the circulating medium. The pump device 106 may further include additional suitable elements or features, depending on the type of pump device 106.

Figure 2:
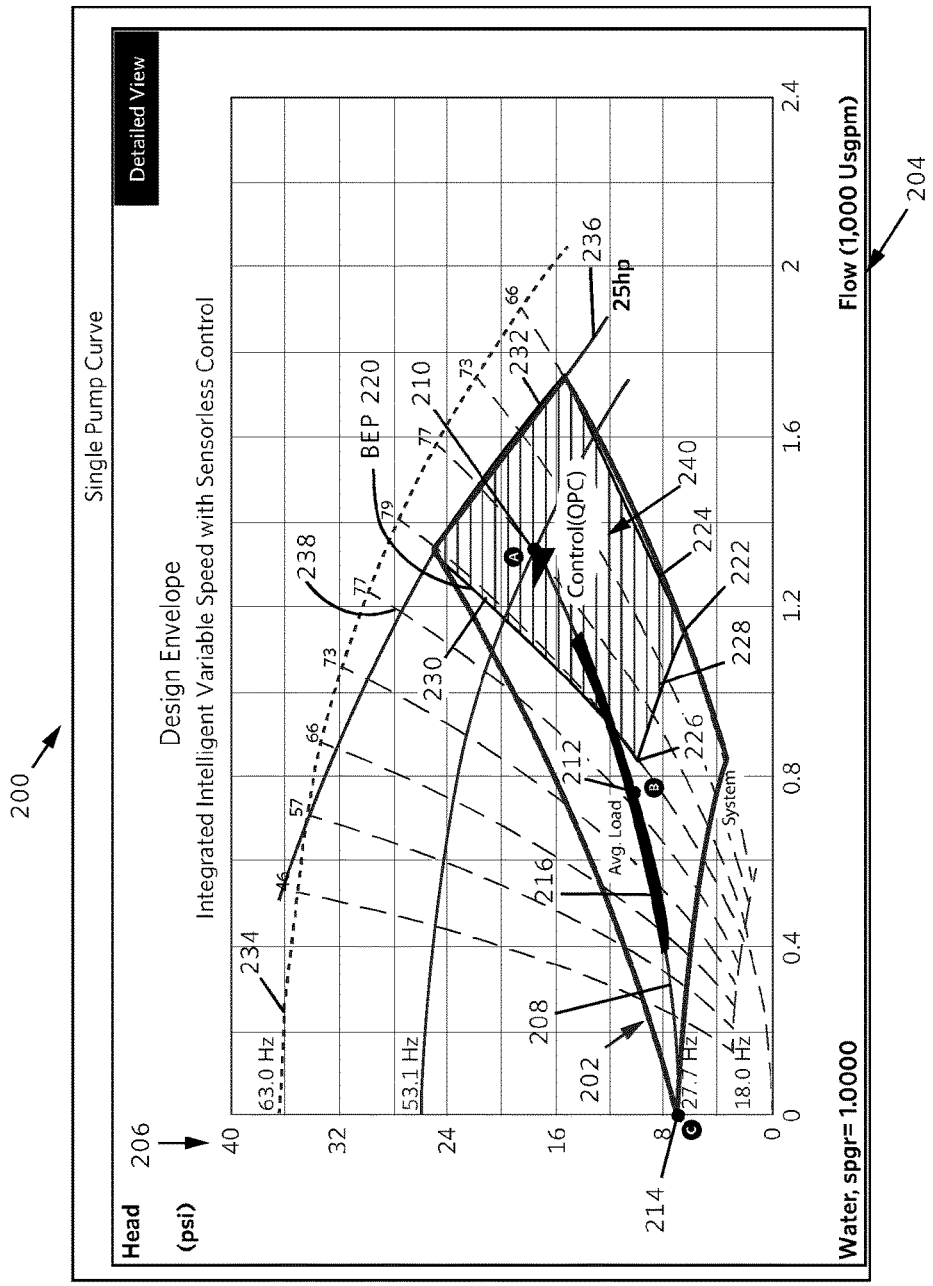
FIG. 2 illustrates an example range of operation of a variable speed control pump.

Reference is now made to FIG. 2, which illustrates a graph 200 showing an example suitable range of operation 202 for a variable speed device. The range of operation 202 is illustrated as a polygon-shaped region or area on the graph 200, wherein the region is bounded by a border represents a suitable range of operation. A design point region 240 is within the range of operation 202 and includes a border which represents the suitable range of selection of a design point for a particular control pump 102. The design point region 240 may be referred to as a "selection range", "composite curve" or "design envelope" for a particular control pump 102. In some example embodiments, the design point region 240 may be used to select an appropriate model or type of control pump 102, which is optimized for part load operation based on a particular design point. For example, a design point may be, e.g., a maximum expected system load as in point A (210) as required by a system such as a building 104 (FIG. 1).

The design point can be estimated by the system designer based on the flow that will be required by a system for effective operation and the head/pressure loss required to pump the design flow through the system piping and fittings. Note that, as pump head estimates may be over-estimated, most systems will never reach the design pressure and will exceed the design flow and power. Other systems, where designers have under-estimated the required head, will operate at a higher pressure than the design point. For such a circumstance, one feature of properly selecting an intelligent variable speed pump is that it can be properly adjusted to delivery more flow and head in the system than the designer specified.

The graph 200 includes axes which include parameters which are correlated. For example, head squared is proportional to flow, and flow is proportional to speed. In the example shown, the abscissa or x-axis 204 illustrates flow in U.S. gallons per minute (GPM) and the ordinate or y-axis 206 illustrates head (H) in pounds per square inch (psi) (alternatively in feet). The range of operation 202 is a superimposed representation of the control pump 102 with respect to those parameters, onto the graph 200.

The relationship between parameters may be defined by particular affinity laws, which may be affected by volume, pressure, and Brake Horsepower (BHP). For example, for variations in impeller diameter, at constant speed:

$$D1/D2=Q1/Q2; H1/H2=D1^2/D2^2; BHP1/BHP2=D1^3/D2^3.$$

For example, for variations in speed, with constant impeller diameter:

$$S1/S2=Q1/Q2; H1/H2=S1^2/S2^2; BHP1/BHP2=S1^3/S2^3.$$

Wherein: D=Impeller Diameter (Ins/mm); H=Pump Head (Ft/m); Q=Pump Capacity (gpm/lps); S=Speed (rpm/rps); BHP=Brake Horsepower (Shaft Power—hp/kW).

As shown in FIG. 2, one or more control curves 208 (one shown) may be defined and programmed for an intelligent variable speed device, such as the control pump 102. Depending on changes to the detected parameters (e.g. external or internal detection of changes in flow/load), the operation of the control pump 102 may be maintained to operate on the same control curve 208 based on instructions from the control device 108 (e.g. at a higher or lower flow point). This mode of control may also be referred to as quadratic pressure control (QPC), as the control curve 208 is a quadratic curve between two operating points (e.g., point A (210): maximum head, and point C (214): minimum head). Reference to "intelligent" devices herein includes the control pump 102 being able to self-adjust operation of the control pump 102 along the control curve 208, depending on the particular required or detected load.

Other example control curves other than quadratic curves include constant pressure control and proportional pressure control. Selection may also be made to another control curve (not shown), depending on the particular application.

Figure 3:
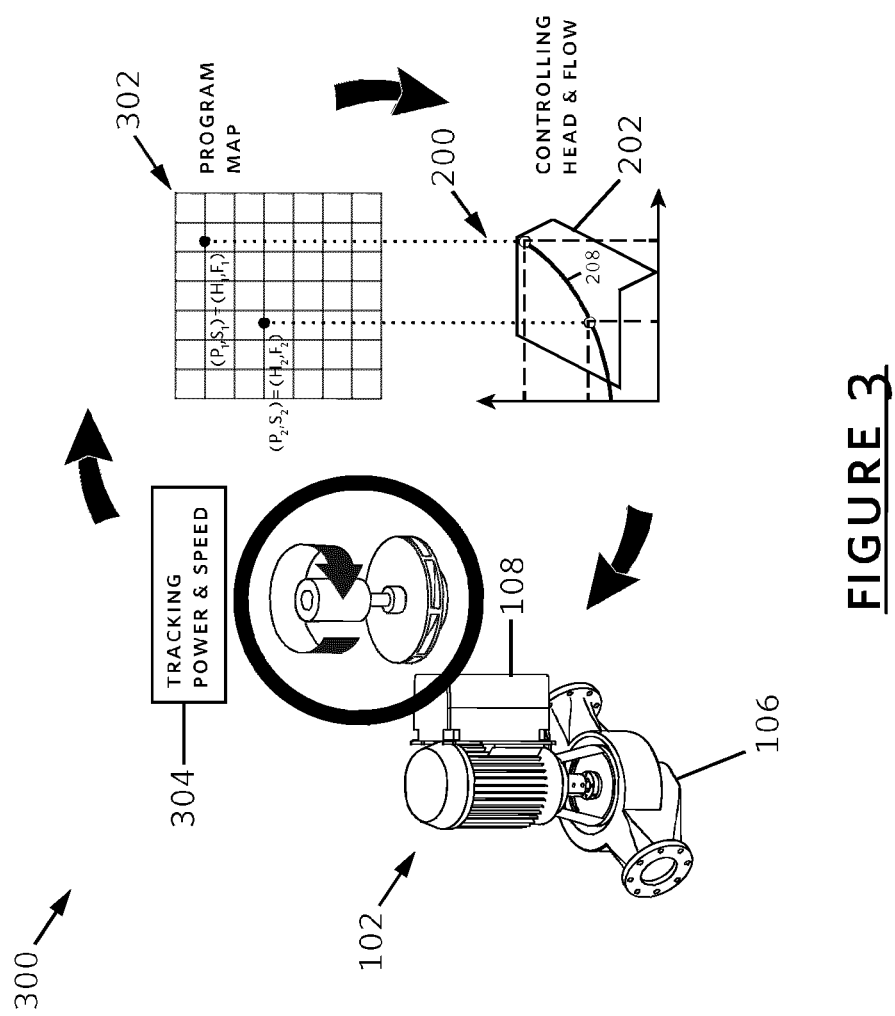
FIG. 3 shows a diagram illustrating internal sensing control of a variable speed control pump.

Reference is now made to FIG. 3, which shows a diagram 300 illustrating internal sensing control of the control pump 102 within the range of operation 202. For example, an external or proximate sensor may not be required in such examples. An internal sensor 304 may be used to detect an amount of power and speed. A program map 302 stored in a memory of the control device 108 is used by the control device 108 to map the detected power and speed to head and flow. During operation, the control device 108 monitors the power and speed of the pump device 106 using the internal sensor 304 and establishes the associated head-flow condition relative to the system requirements. The program map 302 can map the power and speed to maintain operation of the pump device 106 onto a particular setpoint of the control curve 208. For example, referring to FIG. 1, as control valves 112a, 112b, 112c, 112d open or close to regulate flow to the cooling coils (e.g. load 110a, 110b, 110c, 110d), the control device 108 automatically adjusts the pump speed to match the required system pressure requirement at the current flow.

Figure 4:
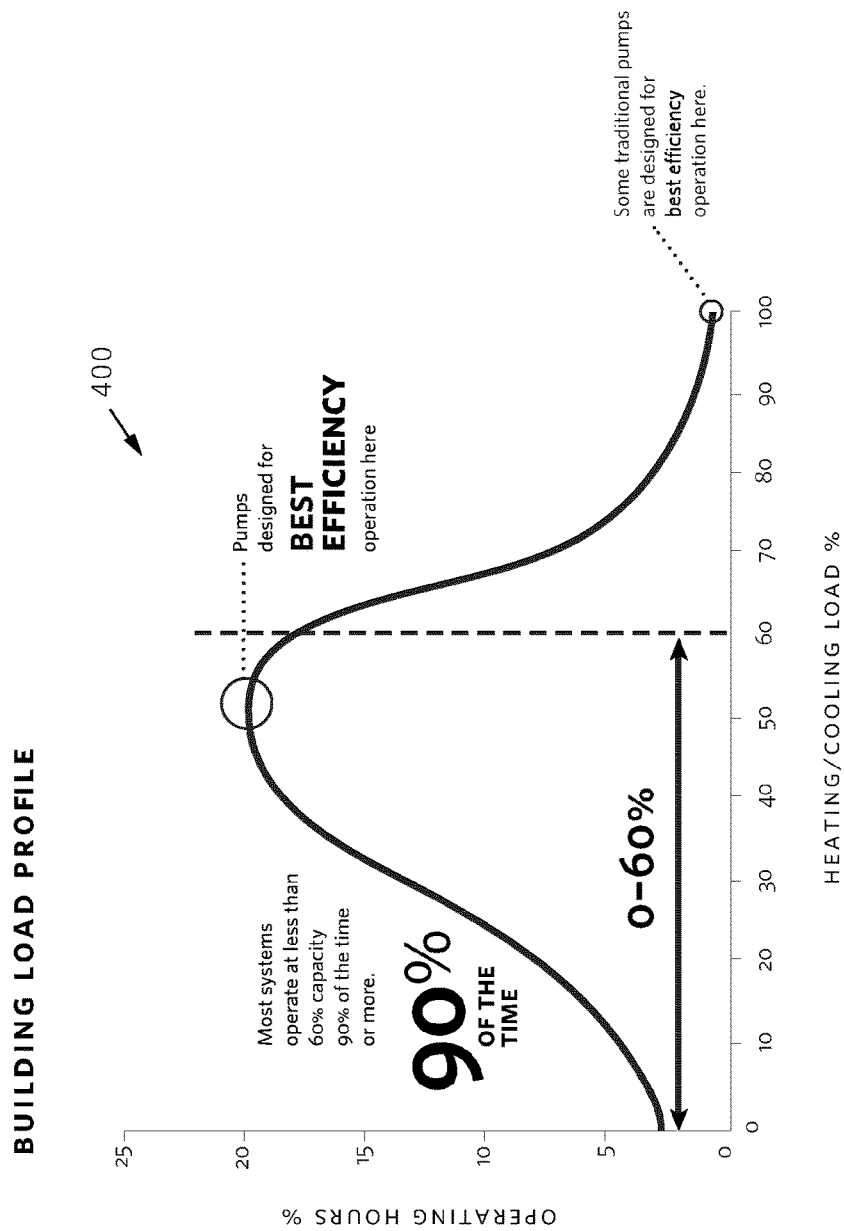
FIG. 4 illustrates an example load profile for a system such as a building.

FIG. 4 illustrates an example load profile 400 for a system such as a building 104, for example, for a projected or measured "design day" or average annual load. The load profile 400 illustrates the operating hours percentage versus the heating/cooling load percentage. For example, as shown, many example systems may require operation at only 0% to 60% load capacity 90% of the time or more. In some examples, a control pump 102 may be selected for best efficiency operation at partial load, for example on or about 50% of peak load. Note that, ASHRAE 90.1 standard for energy savings requires control of devices that will result in pump motor demand of no more than 30% of design wattage at 50% of design water flow (e.g. 70% energy savings at 50% of peak load).

Figure 12:
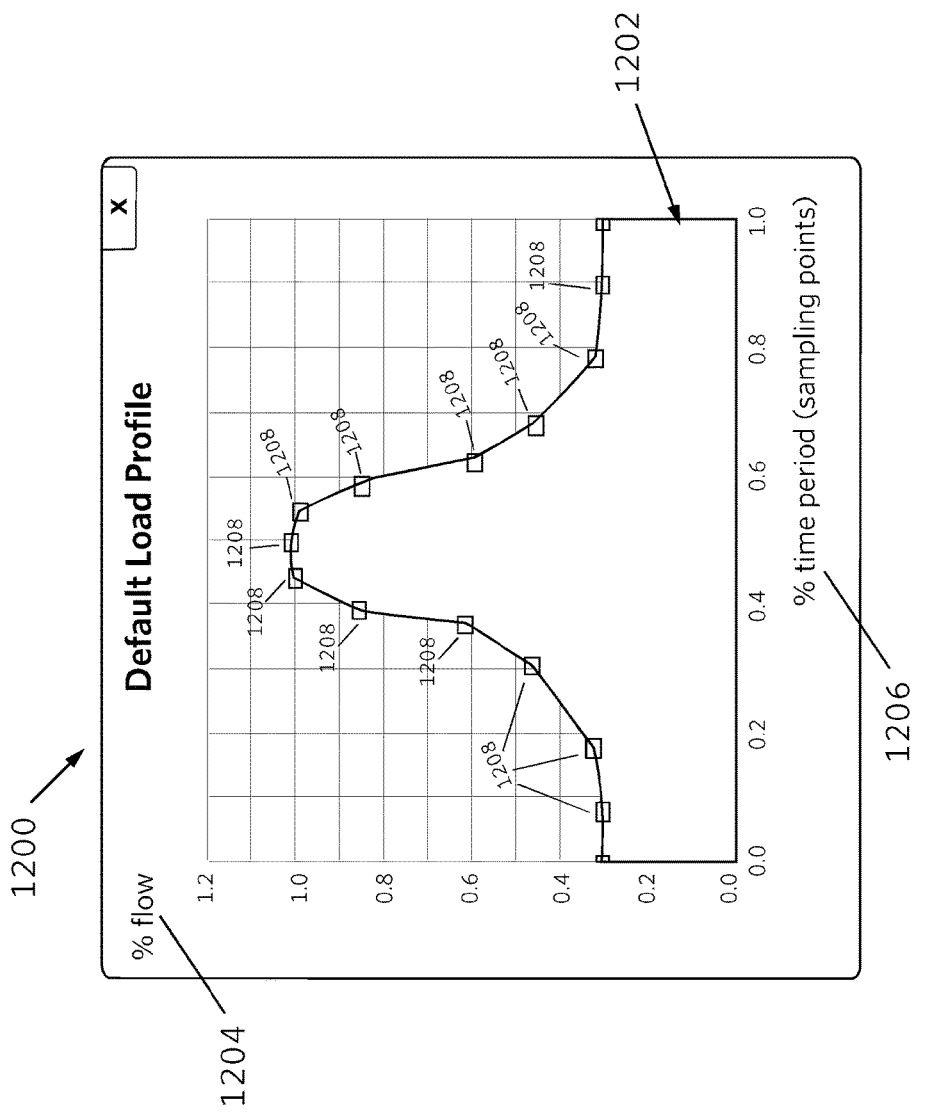
FIG. 12 shows an example graphical user interface (GUI) for configuring a system load profile.

As an initial matter, reference is made to FIG. 12, which shows example graphical user interface (GUI) screen 1200 for configuring a load profile 1202 of a system such as a building 104. The load profile represents a projected or measured percentage flow 1204 for specified time periods 1206, with the percentage flow being across e.g. a "design day" or annual load. The interface screen 1200 is initially presented with a default load profile 1202, as shown. A building designer (user) may wish to configure the load profile to the particular building 104 to something other than the default load profile. As shown, in some example embodiments, the user may select particular sampling points 1208 of the load profile 1202 on the interface screen 1200, and drag those points 1208 to different flow 1204 and time periods 1206, in order to adjust the default load profile to the desired particular projected or measured flow profile of the actual system or building 104. In other example embodiments, the building designer may input specific flow 1204 and time periods 1206 for the particular points 1208 by inputting into a field-based interface (not shown), or by uploading a suitably configured file which provides these values. In other example embodiments, the axes of the load profile 1202 instead may be equivalent to those shown in FIG. 4.

Referring again to FIG. 2, various points on the control curve 208 may be selected or identified based on the default load profile 400 (FIG. 4), shown as point A (210), point B (212), and point C (214). For example, the points of the control curve 208 may be optimized for partial load rather than 100% load. For example, referring to point B (212), at 50% flow the efficiency conforms to ASHRAE 90.1 (greater than 70% energy savings). Point A (210) represents a design point which can be used for selection purposes for a particular system, and may represent a maximum expected load requirement of a given system. Note that, in some example embodiments, there may be actually increased efficiency at part load for point B versus point A. Point C (214) represents a minimum flow and head (Hmin), based on 40% of the full design head, as a default, for example. Other examples may use a different value, depending on the system requirements. The control curve 208 may also include an illustrated thicker portion 216 which represents a typical load range (e.g. on or about 90%-95% of a projected load range for a projected design day). Accordingly, the range of operation 202 may be optimized for partial load operation.

For the control curve 208, with reference again to FIG. 12, a default load profile may not necessarily be used. Rather, the thicker portion 216 may be customized by adjusting the load profile 1202 to measured or projected system loads, through the interface screen 1200. The control curve 208 and thicker portion 216 would be dynamically updated in dependence of the updated load profile 1202. For example, point A (210), point B (212), and point C (214) would be updated accordingly depending on the user defined parameters. The intelligent variable speed device would operate along the updated control curve 208.

Figure 5:
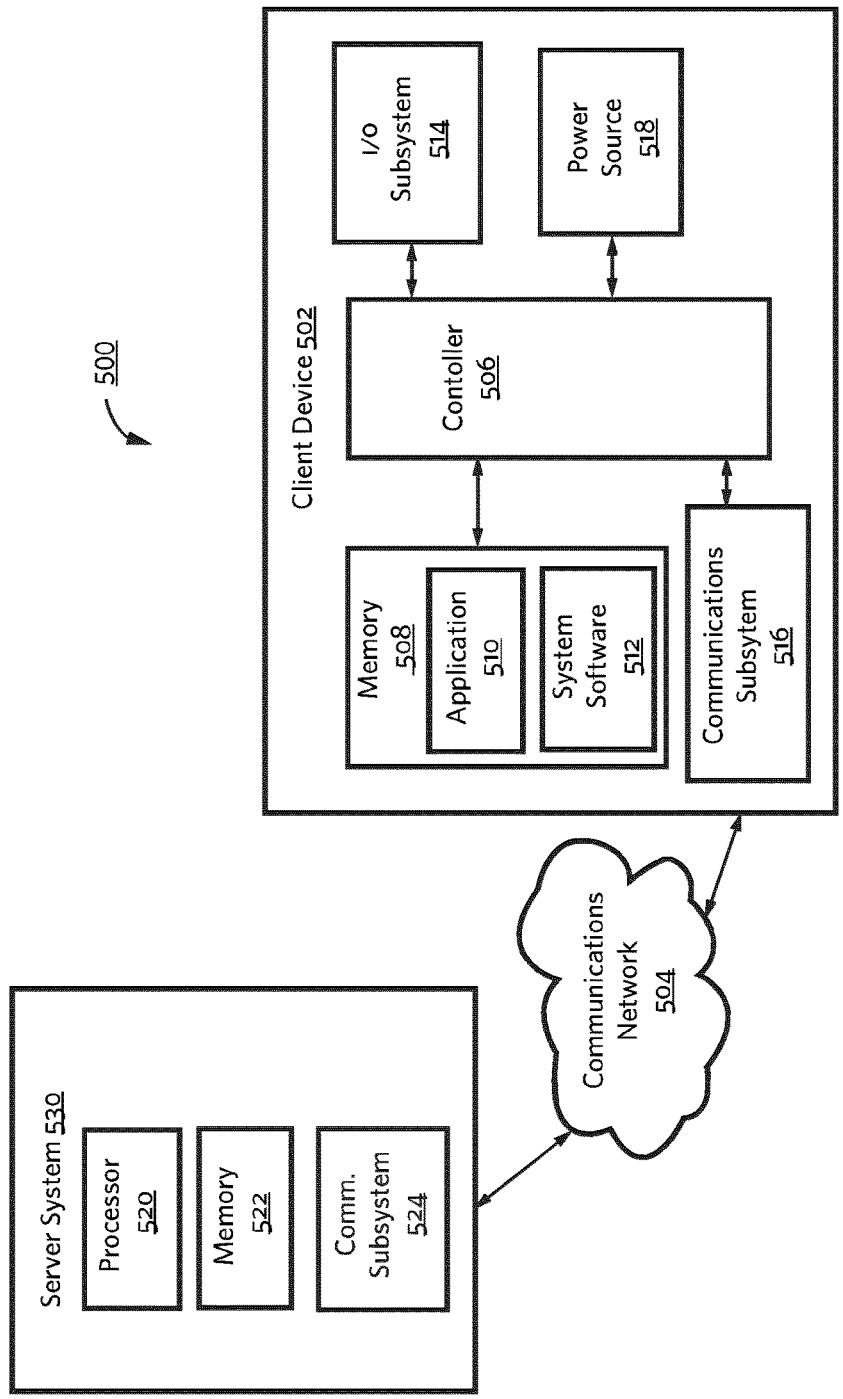
FIG. 5 illustrates an example block diagram of a communication system for facilitating selection of one or more variable speed devices, in accordance with an example embodiment.

FIG. 5 illustrates an example block diagram of a communication system 500 for facilitating selection of one or more variable speed devices from a plurality of devices, in accordance with an example embodiment. For example, the system 500 may be used as a web portal for access by a client device 502 to facilitate selection of a suitable control pump 102. As shown, a server system 530 may communicate with one or more client devices 502 (one shown) over a communications network 504, such as the Internet.

The server system 530 may be configured as a web server which generates graphical user interface (GUI) screens for display on the client device 502. As shown in FIG. 5, in some example embodiments, the server system 530 may include one or more processors 520, at least a memory 522 for storing of system software and databases for devices or items, and at least a communications subsystem 524. The server system 102 may include one or more servers (one shown for ease of illustration).

The memory 522 of the server system 530 may include user information, which can include user information along with associated access rights. For example, a contractor/installer or sales representative may have read-only rights and some restricted access, while employees may have editing rights and/or further access rights. The memory 522 may also include a database of a plurality of devices such as control pumps 102, along with respective model numbers and ranges of operation 202, and design point regions 240 (see FIG. 2).

The client device 502 may include one or more client applications 510. In some example embodiments, the client device 502 may include a controller 506 such as a microprocessor, which controls the overall operation of the client device 502. The controller 506 interacts with other device components such as memory 508, and system software 512 stored in the memory 508 for executing the applications 510, input/output subsystems 514 (e.g. a keyboard, mouse, touchpad, scrollwheel, and/or a display) and a communications subsystem 516. A power source 518 powers the client device 502.

Referring still to FIG. 5, in some example embodiments, the client device 502 may be configured with a web browser which is used to access a web site or web portal of the server system 530, for example to select a suitable control pump 102. The web browser is configured to render the graphical user interface screens onto the display of the device 502, based on information received from the server system 530 or from resident information. The client device 502 may, for example, be a tablet computer, a mobile phone, or general purpose device such as a personal computer. Some example embodiments may include the use of a dedicated installed application or "app" on the client device 502.

In some conventional websites where a user wishes to find a suitable search results for narrowing selection of devices, typically a user is required to manually populate a number of input fields to input desired search parameters, in order to retrieve results of which devices may be appropriate. This may result in unnecessary keystrokes and inputs to the website. In some other conventional websites, devices may already be categorized into predetermined or hard-coded groups, so that all of the devices in a group are retrieved depending on the desired search parameters (e.g. all devices from a particular family or group of models). The predetermined groups may not provide suitable results to the user, as too many results may be displayed. This can provide excessive results and limits flexibility of displaying results for subsequent selection by a user. Also, the user may not be aware of which devices would be most appropriate, which may result in less than optimal selection of an inappropriate or inefficient device for the desired end use or design point.

Figure 6:
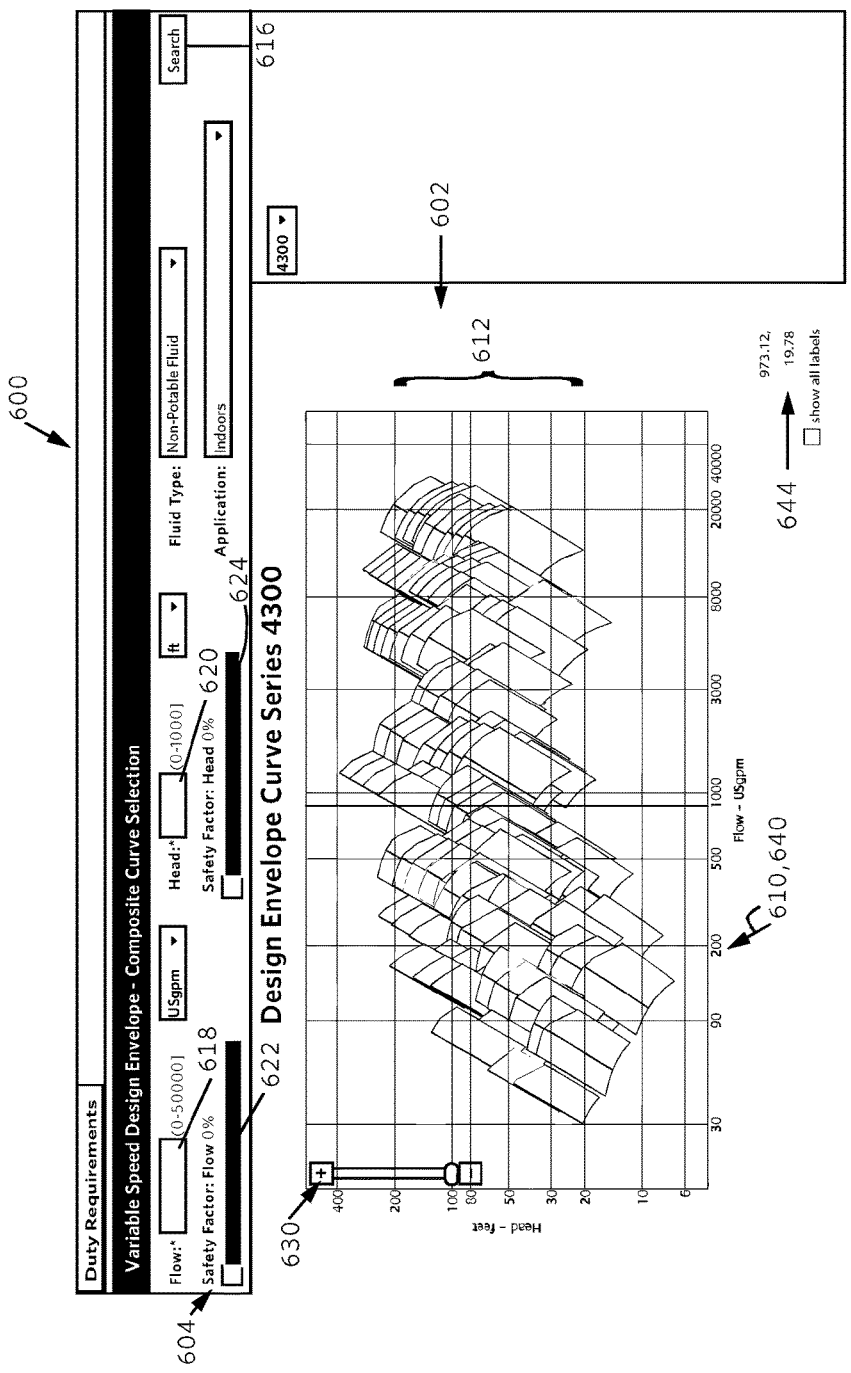
FIG. 6 shows an example graphical user interface (GUI) for display on a device for facilitating selection of a variable speed device, in accordance with an example embodiment.

Reference is now made to FIG. 6, which shows an example graphical user interface (GUI) screen 600 on a display of the device 502 for facilitating selection of one or more variable speed devices, in accordance with an example embodiment. The interface screen 600 may be accessible from a web browser such as Internet Explorer™ or Google Chrome™, for example. A login screen (not shown) with user name and password fields may be used to provide access to the interface screen 600. Referring briefly to FIG. 12, note that successful login will allow access to the GUI screen 1200 for configuring and customizing a user's desired load profile 1202 to measured or projected system specifications.

As shown in FIG. 6, the interface screen 600 includes an interactive graph 602 and a parameters interface 604. The interactive graph 602 provides a dynamic and interactive user experience in order to narrow or specifically select a particular device. For example, real-time processing and response of the graph 602 may be performed by the server system 530 (FIG. 5) in dependence of user input.

Various regions of the interface screen 600 may be navigated using an indicator 610, shown as a pointer arrow icon 640, which is overlaid onto the interface screen 600. The pointer arrow icon 640 may be controlled from an input device such as a mouse, touchpad, scrollball or touchscreen. The pointer arrow icon 640 may be used to select a point or region on the screen 600, which may be performed by selecting, e.g. clicking, from the input device. Further selection may also be performed, for example by "double clicking" using the input device, or other suitable user operations as appropriate such as "right clicking", "middle clicking", "thumb clicking", etc., as would be understood in the art.

In the example embodiment shown, the graph 602 represents Head versus Flow. Each control pump 102 is represented on the graph 602 as a region, "design envelope", or selection range within a composite of a group of design envelopes 612. Each design envelope 612 is based on the design point region 240 for each particular control pump 102.

As shown in FIG. 6, the parameters interface 604 may be used to manually or automatically configure or indicate various search parameters, such as Flow 618 (and units), Head 620 (and units), Fluid Type (e.g. non-potable fluid), Flow safety factor 622, Head Safety Factor 624, and Application (e.g. indoors). A search icon 616 may also be selected to activate a searching function.

Figure 7:
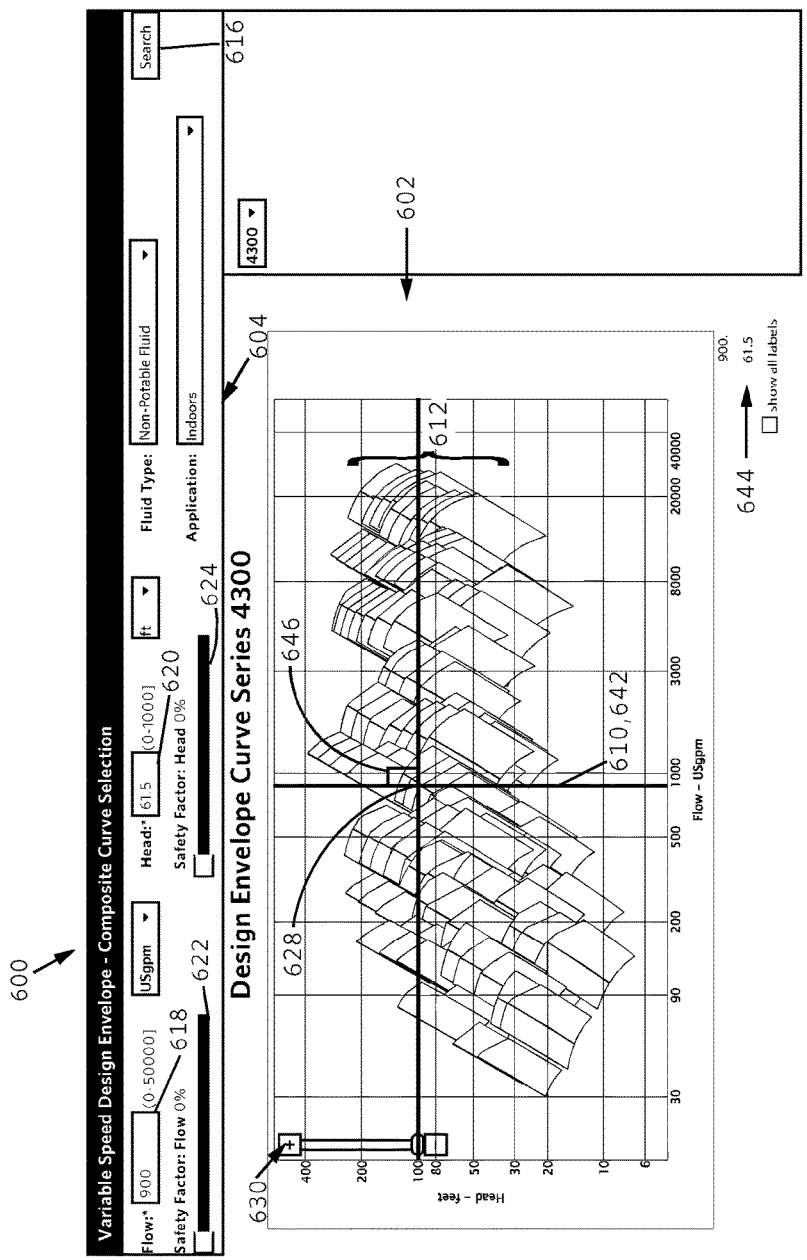
FIG. 7 shows an example graphical user interface (GUI) illustrating a selection function.

Reference is now made to FIG. 7, which shows a selection function of the interactive graph 602. When the indicator 610 is moved or hovered over the interactive graph 602, in some example embodiments the indicator 610 may be converted to a cross-hair indicator 642 (as shown), rather than the pointer arrow icon 640 (FIG. 6). As shown in FIG. 7, the cross-hair indicator 642 may include at least vertical indicator line to indicate the present x-axis value and a horizontal indicator line to indicate the present y-axis value.

As shown in FIG. 7, when the cross-hair indicator 642 is hovered over or overlaid onto the interactive graph 602, the fields for Flow 618 and Head 620 are detailed in a cursor region 644 at the lower right-hand side of the graph 602. The cross-hair indicator 642 is indicated by an intersection of the vertical line representing the Flow and the horizontal line representing the Head, which are overlaid onto the graph 602.

Figure 8:
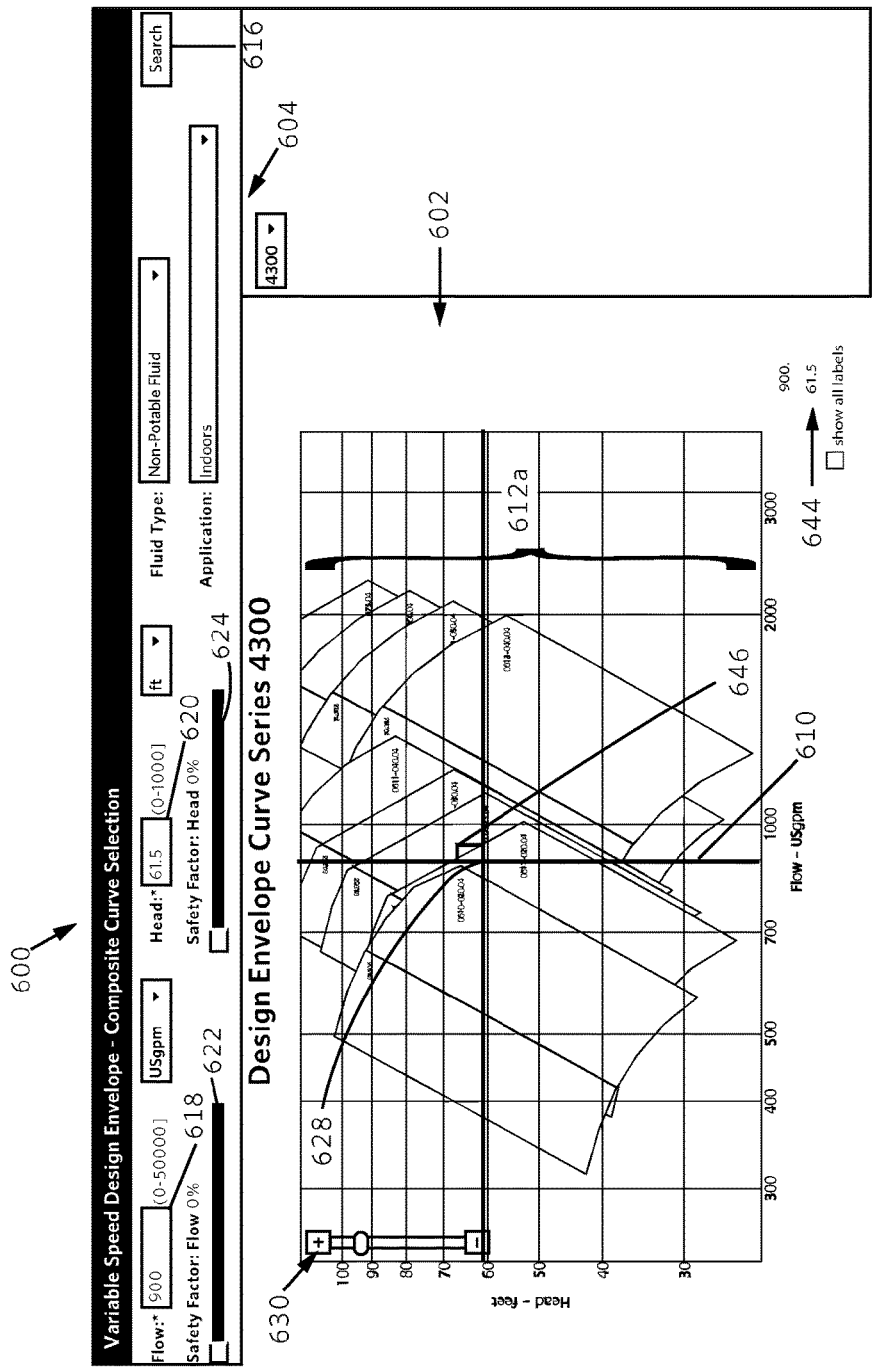
FIG. 8 shows an example graphical user interface (GUI) illustrating a zoom function.

FIG. 8 shows an example zoom function of the graph 602. A selection of a particular point or region on the graph 602 may be performed by e.g. a left click of a mouse from the graph 602 shown in FIG. 7. A user may select a desired design point 628 on the graph 602 (depending on a particular system such as a maximum design point of the building 104, such as "point A" (210) in FIG. 2). Selection of the design point 628 using the cross-hair indicator 642 results in the values in the fields for Flow 618 and Head 620 being fixed or "locked". Accordingly, the cross-hair indicator 642 may become fixed or "locked" into the indicated Flow 618 and Head 620; and the indicator 610 may once again be shown as an arrow pointer 640 (FIG. 6). Another single left click onto the graph 602 may result in unlocking of the cross-hair indicator 642.

In some example embodiments, still referring to FIG. 8, a tolerance or buffer factor may be included in the indicator 610 as indicated by a rectangle region 646 above and to the right of the desired design point 628, so that an area on the graph 602 encompassed by the rectangle 646 is selected rather than a single design point 628.

In some example embodiments, the selection of the particular point 628 or region 646 results in only the relevant design envelopes 612 being displayed (relevance described in detail herein below, which includes devices which are compliant with the selected point 628). In other words, the graph 602 is dynamically updated to remove the non-relevant design envelopes. In some example embodiments, the relevant design envelopes 612a are at least those having a design point region 240 (FIG. 2) which overlap the selected point 628 or region 646.

Referring still to FIG. 8, in some example embodiments, a single selection or left click from the graph 602 shown in FIG. 7 may further result in a zooming operation of the graph 602 to an enlarged version within a same window size. In other words, the single click may result in both zooming of the graph 602 and stripping of non-relevant design envelopes, resulting in the graph 602 shown in FIG. 8. The zooming is zoomed closer into the selected point 628 or region 646. This process may be dynamically performed by the server system 530 for display on the client device 502. The zooming operation may also include centering of the graph 602 to the design point 628.

As shown in FIG. 8, manual zooming may also be performed using the zoom interface 630 by clicking on zoom in (+), zoom out (−), or sliding a slider bar, or using a scrollwheel from an input device. Panning may also be performed by clicking and holding onto the graph 602 and dragging in a direction. In such example embodiments, only the relevant design envelopes 612a may still remain displayed on the graph 602, such as when the cross-hair indicator 610 is locked.

Referring still to FIG. 8, the selected relevant design envelopes 612a may be further selected on the graph 602, for example by double-clicking the point or region on the graph 602. In other example embodiments, this further selection may be performed by selecting the search icon 616.

Figure 9:
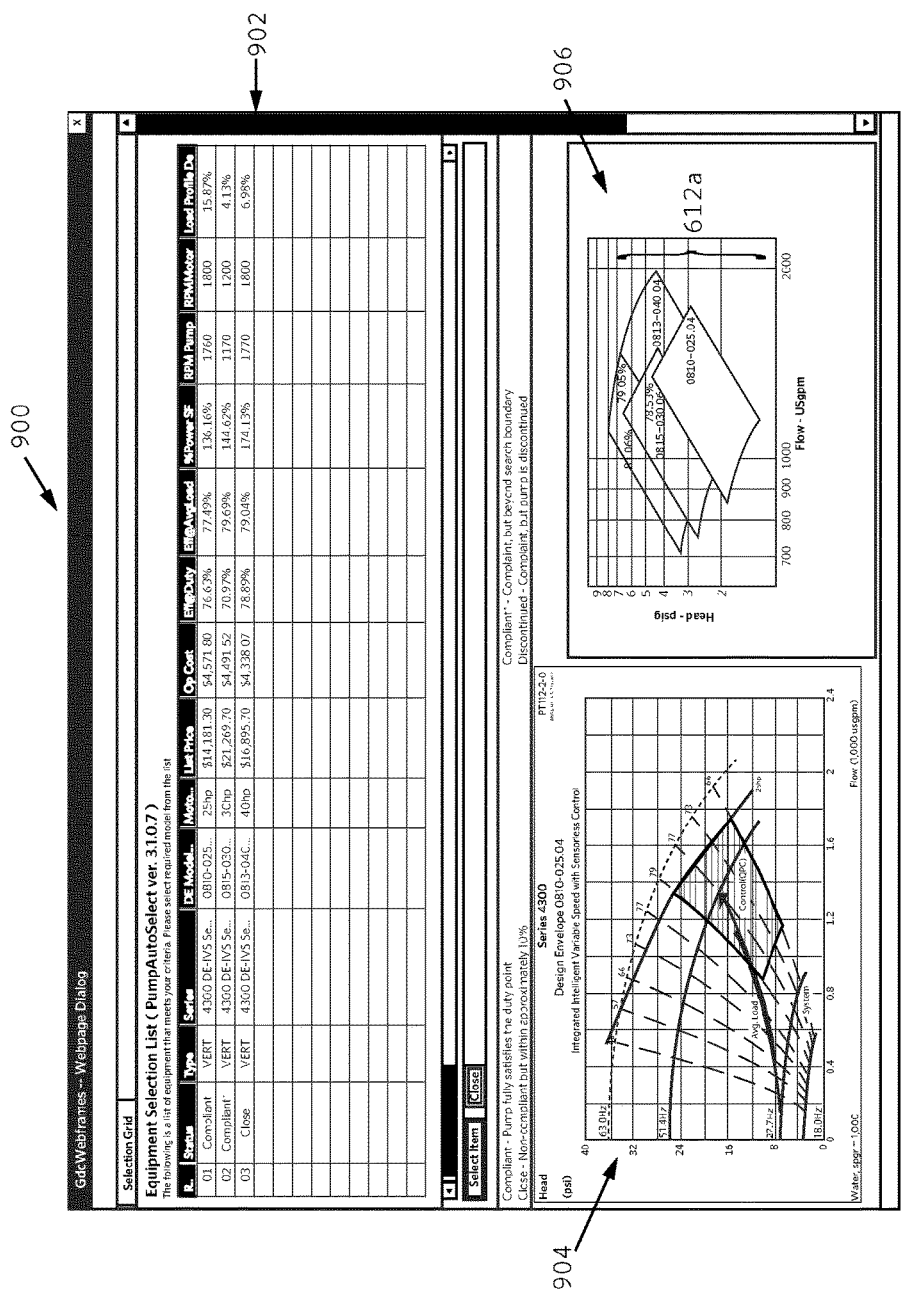
FIG. 9 shows an example graphical user interface (GUI) illustrating a listing of selected devices.

Reference is now made to FIG. 9, which shows an example graphical user interface (GUI) screen 900 illustrating a listing 902 or table of selected pumps, for example as selected from the graph 602 (FIG. 8) by e.g. selecting the search icon 616 or by double-clicking the graph 602 (FIG. 8). As a default, the first device in the listing 902 may be calculated as having a highest priority and may be initially displayed in a details window 904. The details window 904 shows at least the range of operation 202 (FIG. 2) and the design envelope 240 (FIG. 2) of the device. From the GUI screen 900, a given device from the listing 902 may be further selected by e.g. single-clicking that device from the listing 902, with further details for that device instead being displayed in the details window 904. Window 906 displays a similar screen as the zoomed screen 600 (FIG. 8). In some example embodiments, only the relevant design envelopes 612a and their associated model numbers are listed in the listing 902. The non-relevant devices are not listed in the listing 902. The relevant envelopes are indicated as being "compliant", e.g., the pump satisfies the duty point as selected by the user. As shown in FIG. 9, in some example embodiments, example indications of relevance may include "close—non-compliant but within approximately 10%" (or other specified buffer range, which may still be considered an acceptable result depending on the end purposes), "compliant*—compliant, but beyond search boundary", and "discontinued—compliant, but pump discontinued". These are exemplary categories of relevance, of which it would be appreciated that other indicators or categories of relevance may be used. Referring again to FIG. 8, note that when determining relevance or compliance other considerations may be calculated such as the Fluid Type (e.g. non-potable fluid), the Application (e.g. Indoors), the Flow safety factor 622, and/or the Head Safety Factor 624.

Referring still to FIG. 9, the listing 902 can include additional parameters of the devices, for example the ranking, type, model numbers, motor, list price, operational cost, efficiency at duty, efficiency at average load, percent power, RPM pump, RPM motor, and load profile.

Referring still to FIG. 9, in some example embodiments the listing 902 lists the devices which are considered to have relevant design envelopes 612a in a priority order. For example, it may be desired to list the control pumps having the highest priority first. The priority may be based on selected or predetermined settings, which are described in detail herein below. In other example embodiments, a reverse order may be displayed, with the control pumps having the highest priority may be listed last. The priority may be dynamically or automatically calculated by the server system 530 (FIG. 3) in response to user selection of a design point from the graph 602 (FIG. 8). The priority order may be determined using control pump information stored and calculated from the server system 530 (FIG. 5).

The stored inventory of pumps may be stored in memory 522 (FIG. 5) into a database, table or matrix for a full range of commercial pumps, which includes, for example: the pump size, list price, power (bhp) consumed at the design point (of the flow and head intersection), and efficiency at average part load. The database, table or matrix for each pump may also store information which includes: the pump size, operating cost (per year), power consumed at average part load, efficiency at average part load.

Example embodiments may have the priority of listing be at least based on part load operation of each device for a specified period of time. In some example embodiments, the initial selection of the highest priority order device may require that the lowest part load operating cost selection also be the lowest list price selection. If this is not the case, it is determined that the lowest operating cost difference requires a "payback" of the difference between the pricing of the higher list price and lower list price of the model with the higher operating cost. For example, this may be based on 3 years operation at $0.10/kWh (to assist in normalization, USD markets may calculate payback at a 0.50 discount level due to discounted pricing used in that market). If the payback were greater than 3 years the lower cost unit with the higher operating cost replaces the lowest operational cost unit as a higher-ranked selected unit.

Accordingly, a Calculate Cost Saving Index may be calculated for each item (e.g. control pump) using the following formula:

$$CS_i = LP_i + r^*OC_i;$$

wherein i is the current item, having a range of 1. . . n (number of items in selection); LP is the item List Price (in dollars); OC is the item operating cost (e.g. cost per year operating at part loads according to the load profile); and r is the market index (in years, e.g. equals 6 for U.S. dollar market or 3 for other markets). The result of this stage is an array of indexes CS[n], wherein n is the total number of items in selection. The Cost Saving Index can represent a tradeoff of fixed cost for operating cost at various part loads over a specified time period, as determined by the load profile. The specified time period is typically greater than one year, and can be 3 years in some example embodiments. For example, 3 years is one regularly used industry acceptable payback period on the capital expenditure for items such as HVAC equipment.

The operating cost (OC) can be calculated based from the load profile, as shown in FIG. 12. For a default load profile, as shown in FIG. 12, an average part load may be represented as a calculated percentage e.g. 57% load (or specifically 56.95%) for operating cost calculation purposes. This value is pre-calculated from the default load profile. However, using the interface screen 1200, the load profile may be changed by user control by dragging the sampling points 1208, or by uploading a desired load profile. For such customized load profiles, an annual percentage load can be calculated from the resultant customized load profile, by integrating the flow 1204 over the sampling points 1208. The annual operating cost at part loads can then be calculated from the annual percentage load.

Note that, 3 years is a conservative estimate of the market expectation of simple payback of value-added costs. In other example embodiments, the specified time period may be a typical expected lifetime of the item, for example on or about 20 years, or more in some examples. In reality, some devices can last much longer, to at least 35-40 years. In other example embodiments, a warranty period can be used as the specified time period.

Figure 10:
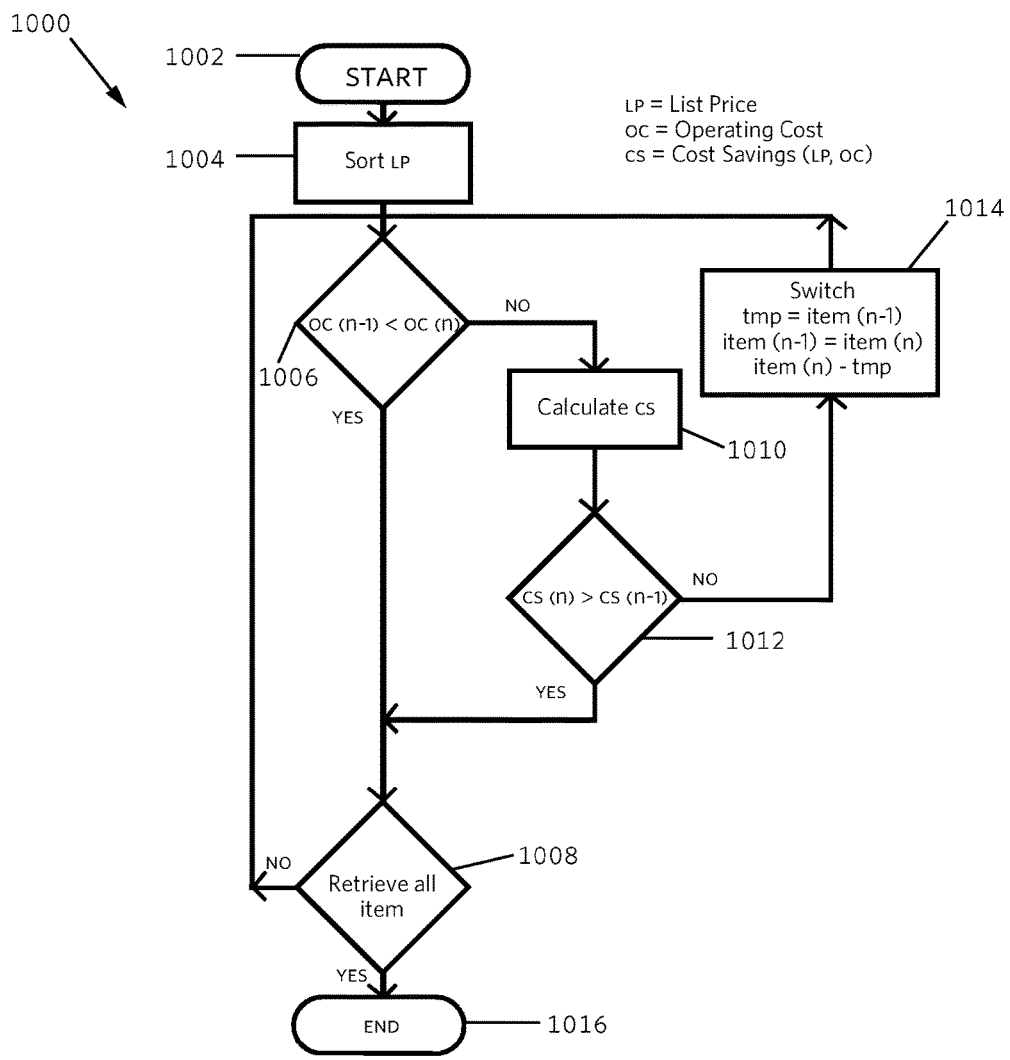
FIG. 10 shows an example flow diagram of a method for prioritizing a listing of devices.

As shown in FIG. 10, the Cost Saving Index may be used to assign a priority for each item which is applied to rank all of the selected items (e.g. variable speed pumps). The example method 1000 shown in FIG. 10 may be used to sort the pumps in a priority order based on the assigned priorities. At event 1002, the method 1000 begins (i=initialized), for example in response to double-clicking on the graph 602 (FIG. 8). In some example embodiments, only the relevant design envelopes 612a (FIG. 8) and respective pumps are considered for the priority sorting. At event 1004, the pumps are initially sorted by List Price (LP), e.g. from lowest to greatest. At event 1006, it is determined whether an Operating Cost (OC) of each pump (i−1) is less than an OC of the next higher priced pump (i). If so ("yes"), at event 1008 the next item is considered (i=i+1), until all relevant pumps have been considered.

Referring again to event 1006, if the OC of a pump (i−1) is greater than an OC of the next highest pump (i) (if "no"), the method 1000 proceeds to event 1010 which calculates the Cost Savings Index (CS). At event 1012, it is determined whether the CS(i) is greater than the CS(i−1), and if not (if "no"), the higher listing priced item (i) is considered to have a higher priority ranking than the other item (i−1) and the rankings are switched. If so (if "yes"), this priority order stays the same and the method 1000 proceeds to event 1008 and the next item is considered (i=i+1). At event 1016, the final priority order ranking is completed for all items. The final priority order ranking may then be displayed, for example within the listing 902 (FIG. 9). Thus, priority is assigned to each item based on the CS. Although a "bubble sort" type of ranking method is described at method 1000, other sorting methods may be used in example embodiments so that the items are suitably ranked in priority order.

In some example embodiments, the Cost Savings Index can be thought of as first calculating a Payback (PB)=LP(i−1)−LP(i). It can then be determined whether the PB is greater than the operating cost (OC) savings over the payback period of e.g. 3 years, wherein the OC savings are, e.g. OC(i)*r−OC(i−1)*r.

In some example embodiments, the cost savings index may be one factor used in combination or weighted with other factors in order to determine the priority order. Other example factors include but are not limited to: best value, best speed, lowest price, highest efficiency, closest to target growth capacity, closest to best efficiency point (BEP) flow (on average load flow), highest average load efficiency, lowest delta load efficiency, and lowest operating cost.

Thus, reference is now made to FIG. 11, which shows a GUI screen 1100 for permitting manual configuration of a priority order of the selected variable speed devices, e.g. control pumps. As shown, a user can configure a number of parameters in order to assign priorities for each device. A weighting may be calculated in accordance with the selected priorities. In some example embodiments, the Cost Savings Index (CS) field 1102 can be configured by a user as an additional parameter to be considered. The parameters may be normalized when calculating the final priority order. As shown, the configurable parameters include some or all of: best value 1104, best speed 1106, lowest price 1108, highest efficiency 1110, closest to target growth capacity 1112, closest to best efficiency point (BEP) flow (on average load flow) 1114, highest average load efficiency 1116, lowest delta load efficiency 1118, and lowest operating cost 1120. Each parameter may include a user selectable dropdown menu to select a priority number 1122 (shown as 1 to 6, 1 being the highest priority). Each priority number can be associated with a weight, as illustrated by the priority weights 1124. The weight for each parameter can then be calculated as a percentage weight 1126, as shown. A priority number of 0, or some other indicator, can represent no weight to be assigned for that priority number. The total weight 1128 is calculated and displayed. The priority for each device can be calculated and assigned based on the configuration settings.

For example, a difficulty with some existing conventional systems is that items may be listed in a predetermined order of model number or list price. This may not provide the user with the most relevant item from a cost perspective. Accordingly, an improper or sub-optimal item may be selected in such conventional systems.

Referring again to FIG. 2, methods for particularly defining boundaries for the design point region 240 or "design envelope" will now be described in greater detail, in accordance with some example embodiments. At least some of the boundaries may be determined by the server system 530 (FIG. 5) with the resultant design point region 240 being stored in memory 522 (FIG. 5). In some example embodiments, the boundaries are dynamically generated by the server system 530 (FIG. 5), for example each time information of a new device is added to the memory 522. The design point region 240 or "design envelope" for each device can then be used to populate the design envelopes 612 (FIG. 6) as displayed on a client device 502 (FIG. 5). An appropriate design point of a device, shown as point A (210) in this example, may be selected within the design point region 240. For example, point A (210) may be a maximum expected head and flow value for a particular system or building 104 (FIG. 1). An initial definition of the boundaries will be described, followed by adjustments to the boundaries that may be made in accordance with some example embodiments. Both the initial definition and the adjustments may be based on finding the lowest operating costs at the best price, and may include using factors from the Cost Savings Index described in detail above.

The boundaries may be based on at least an efficiency curve of a device, such as a best efficiency point (BEP) curve 220 of a control pump 102, as would be understood in the art. The right-hand (RH) edge 224 of the design envelope may be based on, e.g. on or about 135% of the BEP curve 220. Note that the design point, point A (210), remains to the right of the BEP curve 220. Accordingly, the resultant range of operation 202 of the selected device may be optimized for partial load operation.

In other examples the design envelope may extend to on or about 10% to the left of BEP curve 220 and point A (210) may be selected in that region; however the energy savings may not be as significant as selecting to the right of the BEP curve 220.

For example, a difficulty with some traditional constant speed systems is that a design point (Point A) is selected to the left of the BEP curve, resulting in optimization only for full load operation. Some traditional constant speed pumps were sized slightly to the left of BEP curve so that if oversized, the duty would drift to the right and thus operate at BEP curve.

A low flow and head point 222 on the design envelope 240 may be defined by, e.g., on or about 63% of the flow value and on or about 40% of the maximum head value of the right-hand (RH) edge 224 of the design envelope 240. A low flow and head point 226 on the design envelope 240 may be defined by, e.g., on or about 63% of the flow value and on or about 40% of the maximum head value of the left-hand edge 230. In some example embodiments, a lower boundary 228 is defined by a pump speed curve (shown in Hertz; alternatively in rpm) between the low head point 222 and the low flow point 226. In other example embodiments, the lower boundary 228 is defined by a straight line which connects the low flow and head point 22 with the other low flow and head point 226.

The left-hand edge 230 of the design envelope 240 may be defined by the BEP curve 220. In some examples (not shown), the left-hand edge 230 of the design envelope 240 extends to the left of the BEP curve 220 up to and including the left-hand edge of the range of operation 202. The left-hand edge 230 of the design envelope 240 may be defined by another efficiency curve, such as a partial efficiency curve, such as a 77% efficiency curve 238.

In some example embodiments, the top edge 232 of the design envelope 240 may also be further defined by the motor power curve 236 (e.g. maximum horsepower) between the intersection of the left-hand edge 230 of the design envelope 240 (e.g. the BEP curve 220 or the 77% efficiency curve 238) with the power curve 236 and the right-hand edge 224 of the design envelope 240 with the power curve 236. In some example embodiments where the left-hand edge 230 of the design envelope 240 is to the left of the BEP curve 220, the top edge 232 boundary may be the pump speed curve operating at an appropriate or suitable speed (shown in Hz, such as pump speed curve 234) rather than a strict maximum motor power curve 236.

In some example embodiments, the motor power curve 236 may truncate a top-right boundary in some example embodiments. Thus, the electrical load limits of the particular control pump 102 may also at least partially define the design envelope 240.

It would be appreciated that example embodiments of the design envelope 240 comply with industry standards and codes for part load performance, such as ASHRAE 90.1 standard for energy savings of 70% at 50% design day flow, or 20:1 turn down capacity for a chiller plant.

In some example embodiments, separate design envelopes may be separately defined for each motor size of a given pump size.

Referring again to FIG. 8, each control pump 102 may be represented by a respective design envelope (collectively referred to as 612). In some example embodiments, the above-described method or methods may result in gaps remaining between the design envelopes 612. This may not be acceptable as users would not know which model to use for conditions within the gaps. Accordingly, this may result in reducing "orphaned" or unassigned design point regions 612 for a particular design point. In some example embodiments, it is determined if the envelope on the left of the gap should be extended to the right, or if the envelope on the right should be extended leftwards; and/or a specified ratio or combination of those two processes may be used to produce optimal results. In some example embodiments, this determination may include considering the lowest operating costs at the best list price, for example using factors from the Cost Savings Index described above. For example, a calculation may be made as to whether there is a better Cost Savings Index when extending an envelope on the left of the gap to the right; or when extending the envelope on the right leftwards; and/or a specified ratio or combination of those two processes to produce optimal Cost Savings Index. Other limits may be imposed to limit extending of the right or left boundaries, such as due to operational limitations from the range of operation 202 (FIG. 2).

Variations may be made in example embodiments. Some example embodiments may be applied to any variable speed device, and not limited to variable speed control pumps. For example, some additional embodiments may use different parameters or variables, and may use more than two parameters (e.g. three parameters on a three dimensional graph). For example, the speed (rpm) is also illustrated on the described control curves. Further, temperature (Fahrenheit) versus temperature load (BTU/hr) may be parameters or variables which are considered for control curves, for example controlled by a variable speed circulating fan. Note that pressure is proportional to temperature. Some example embodiments may be applied to any variable speed devices which are dependent on two or more correlated parameters. Some example embodiments can include selection ranges dependent on parameters or variables such as liquid, temperature, viscosity, suction pressure, site elevation and number of pump operating.

While some of the present embodiments are described in terms of methods, a person of ordinary skill in the art will understand that present embodiments are also directed to various apparatus such as a server apparatus including components for performing at least some of the aspects and features of the described methods, be it by way of hardware components, software or any combination of the two, or in any other manner. Moreover, an article of manufacture for use with the apparatus, such as a pre-recorded storage device or other similar non-transitory computer readable medium including program instructions recorded thereon, or a computer data signal carrying computer readable program instructions may direct an apparatus to facilitate the practice of the described methods. It is understood that such apparatus, articles of manufacture, and computer data signals also come within the scope of the present example embodiments.

While some of the above examples have been described as occurring in a particular order, it will be appreciated to persons skilled in the art that some of the messages or steps or processes may be performed in a different order provided that the result of the changed order of any given step will not prevent or impair the occurrence of subsequent steps. Furthermore, some of the messages or steps described above may be removed or combined in other embodiments, and some of the messages or steps described above may be separated into a number of sub-messages or sub-steps in other embodiments. Even further, some or all of the steps of the conversations may be repeated, as necessary. Elements described as methods or steps similarly apply to systems or subcomponents, and vice-versa.

The term "computer readable medium" as used herein includes any medium which can store instructions, program steps, or the like, for use by or execution by a computer or other computing device including, but not limited to: magnetic media, such as a diskette, a disk drive, a magnetic drum, a magneto-optical disk, a magnetic tape, a magnetic core memory, or the like; electronic storage, such as a random access memory (RAM) of any type including static RAM, dynamic RAM, synchronous dynamic RAM (SDRAM), a read-only memory (ROM), a programmable-read-only memory of any type including PROM, EPROM, EEPROM, FLASH, EAROM, a so-called "solid state disk", other electronic storage of any type including a charge-coupled device (CCD), or magnetic bubble memory, a portable electronic data-carrying card of any type including COMPACT FLASH, SECURE DIGITAL (SD-CARD), MEMORY STICK, and the like; and optical media such as a Compact Disc (CD), Digital Versatile Disc (DVD) or BLU-RAY Disc.

Variations may be made to some example embodiments, which may include combinations and sub-combinations of any of the above. The various embodiments presented above are merely examples and are in no way meant to limit the scope of this disclosure. Variations of the innovations described herein will be apparent to persons of ordinary skill in the art having the benefit of the present disclosure, such variations being within the intended scope of the present disclosure. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein intends to cover and embrace all suitable changes in technology.

The invention claimed is:

1. A method for facilitating selection from a plurality of devices for operation in a system that has load requirements represented by a first parameter and a second parameter, the method being implemented by a processor and comprising:
generating for display on a graphical interface screen a graph of the first parameter versus the second parameter, the graph having displayed thereon a plurality of regions, each region representing a selection range of one of the plurality of devices that is dependent on at least the first parameter and the second parameter, the first parameter and the second parameter being correlated, wherein each device includes a variably controllable motor;
receiving selection of at least a point of the graph from an indicator overlaid onto the graph and which is moveable on the graphical interface screen based on control from an input device, wherein the point is a design point of the system, that represents a maximum expected operating point for the system; and
in response to said selection, generating for display on the graph only the regions that overlap with the selected point and zooming within the graph to the selected point, wherein the selection range of the devices having the overlapped regions with the selected point are optimized for operation of their variable controllable motor at part loads for the design point of the system,
wherein one of the devices having one of the overlapped regions is for operation in the system.

2. The method as claimed in claim 1, further comprising, when displaying the graph having only the relevant regions, receiving a further command through the graphical interface screen and in response generating for display a listing of the devices having the relevant regions.

3. The method as claimed in claim 2, wherein the listing of the devices is listed in a priority order.

4. The method as claimed in claim 1, wherein the indicator includes a pointer icon.

5. The method as claimed in claim 1, wherein the indicator includes an intersection of a first indicator line indicating the first parameter on the graph with a second indicator line indicating the second parameter on the graph.

6. The method as claimed in claim 1, wherein the devices are variable speed devices.

7. The method as claimed in claim 1, wherein the devices are variable speed control pumps.

8. The method as claimed in claim 1, wherein the first parameter is a pressure parameter or a flow parameter and the second parameter is the other of the pressure parameter or the flow parameter.

9. The method as claimed in claim 1, wherein the graphical interface screen is generated from a server.

10. The method as claimed in claim 9, wherein the server is a web server accessible over the Internet.

11. A computer system for facilitating selection from a plurality of devices for operation in a system that has load requirements represented by a first parameter and a second parameter, the computer system comprising:
   a processor; and
   memory for storing information of a plurality of devices and of a selection range for each device dependent on at least a first parameter and a second parameter, the first parameter and the second parameter being correlated, wherein each device includes a variably controllable motor;
   the processor being configured to execute instructions stored in memory to:
   generate for display on a graphical interface screen a graph of the first parameter versus the second parameter, the graph having displayed thereon a plurality of regions, each representing one the selection ranges,
   receive selection of at least a point of the graph from an indicator overlaid onto the graph and that is movable on the graphical interface screen based on control from an input device, wherein the point is a design point of the system, that represents a maximum expected operating point for the system, and
   in response to said selection, generate for display on the graph only the regions that overlap with the selected point and zooming within the graph to the selected point, wherein the selection range of the devices having one of the overlapped regions with the selected point are optimized for operation of their variable controllable motor at part loads for the design point of the system,
   wherein one of the devices having the overlapped regions is for operation in the system.

12. A non-transitory computer readable medium having instructions stored thereon executable by a processor for facilitating selection from a plurality of devices for operation in a system that has load requirements represented by a first parameter and a second parameter, the instructions comprising:
   instructions for generating for display on a graphical interface screen a graph of the first parameter versus the second parameter, the graph having displayed thereon a plurality of regions, each region representing a selection range of one of the plurality of devices that is dependent on at least the first parameter and the second parameter, the first parameter and the second parameter being correlated, wherein each device includes a variably controllable motor;
   instructions for receiving selection of at least a point of the graph from an indicator overlaid onto the graph and that is moveable on the graphical interface screen based on control from an input device, wherein the point is a design point of the system, that represents a maximum expected operating point for the system; and
   instructions for, in response to said selection, generating for display on the graph only the regions that overlap with the selected point and zooming within the graph to the selected point, wherein the selection range of the devices having the overlapped regions with the selected point are optimized for operation of their variable controllable motor at part loads for the design point of the system,
   wherein one of the devices having one of the overlapped regions is for operation in the system.

* * * * *